(12) United States Patent
Soeno et al.

(10) Patent No.: US 9,029,871 B2
(45) Date of Patent: May 12, 2015

(54) SEMICONDUCTOR DEVICE

(71) Applicants: Akitaka Soeno, Toyota (JP); Toshimasa Yamamoto, Ichinomiya (JP)

(72) Inventors: Akitaka Soeno, Toyota (JP); Toshimasa Yamamoto, Ichinomiya (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/982,519

(22) PCT Filed: Nov. 21, 2012

(86) PCT No.: PCT/JP2012/080159
§ 371 (c)(1),
(2) Date: Jul. 30, 2013

(87) PCT Pub. No.: WO2014/080471
PCT Pub. Date: May 30, 2014

(65) Prior Publication Data
US 2015/0041887 A1  Feb. 12, 2015

(51) Int. Cl.
*H01L 29/161* (2006.01)
*H01L 29/78* (2006.01)
*H01L 29/423* (2006.01)
*H01L 29/10* (2006.01)
*H01L 29/08* (2006.01)

(52) U.S. Cl.
CPC ........ *H01L 29/7813* (2013.01); *H01L 29/4236* (2013.01); *H01L 29/1095* (2013.01); *H01L 29/0878* (2013.01)

(58) Field of Classification Search
CPC ............... H01L 29/1608; H01L 29/66068; H01L 29/1602; H01L 29/7802; H01L 29/6606
USPC .............................................. 257/33, 77, 330
See application file for complete search history.

(56) References Cited

U.S. PATENT DOCUMENTS

2010/0163988 A1* 7/2010 Chow et al. .................. 257/342
2010/0224932 A1  9/2010 Takaya et al.
2011/0121316 A1* 5/2011 Harada ............................ 257/77

FOREIGN PATENT DOCUMENTS

JP  2007-242852 A  9/2007

* cited by examiner

*Primary Examiner* — Monica D Harrison
(74) *Attorney, Agent, or Firm* — Kenyon & Kenyon LLP

(57) ABSTRACT

A semiconductor device includes a first semiconductor layer surrounding a bottom of the trench gate, a second semiconductor layer disposed along one of end portions of the trench gate in a longitudinal direction of the trench gate, one of end portions of the second semiconductor layer contacting the body layer and the other of the end portions of the second semiconductor layer contacting the first semiconductor layer, and a connecting layer, one of end portions of the connecting layer being connected to the body layer and the other of the end portions of the connecting layer being connected to the first semiconductor layer, the connecting layer contacting the second semiconductor layer, and the connecting layer being separated from the one of the end portions of the trench gate in the longitudinal direction of the trench gate by the second semiconductor layer.

3 Claims, 8 Drawing Sheets

SEMICONDUCTOR DEVICE

CROSS REFERENCE TO RELATED APPLICATION

This is a national phase application based on the PCT International Patent Application No. PCT/JP2012/080159 filed on Nov. 21, 2012, the entire contents of which are incorporated herein by reference.

TECHNICAL FIELD

The present invention as described herein relates to a semiconductor device.

BACKGROUND ART

According to an insulated gate type semiconductor device for a power device, a high voltage and a low on-resistance generally have a trade-off relationship. A MOSFET having a floating structure at a bottom of a trench has the high voltage, but at the same time, it has a problem of deterioration in on-resistance property. In order to cope with this problem, Patent Document 1 provides a low concentration p-layer for connecting a p-type body layer and the floating structure at the bottom of the trench such that the low concentration p-layer comes in contact with end portions of the trench in a longitudinal direction of the trench. The low concentration p-layer is allowed to have a high resistance when a gate voltage is turned off so as to maintain the floating structure and to secure the high voltage, whereas the low concentration p-layer serves as a carrier supply path from the body layer to the floating structure when the gate voltage is turned on so as to improve the on-resistance property.

CITATION LIST

Patent Literature

Patent Document 1: Japanese Patent Application Publication No. 2007-242852

SUMMARY OF INVENTION

Technical Problem

When the low concentration p-layer is provided along the end portions of the trench in the longitudinal direction of the trench, as disclosed in the Patent Document 1, and when the low concentration p-layer is in contact with the end portions of the trench in the longitudinal direction of the trench, the low concentration p-layer may be damaged and reduced in a step of manufacturing the semiconductor device, such as when a gate insulating film is formed. Therefore, it is necessary to secure a wide process margin. Further, when the low concentration p-layer is examined by an electron microscope or by SIMS during an inspection process, and when the low concentration p-layer is in contact with the end portions of the trench along the longitudinal direction of the trench, it is difficult to examine the low concentration p-layer due to an edge effect of the trench.

Solution to Technical Problem

The description herein provides a semiconductor device including a first conductivity type drift layer; a second conductivity type body layer contacting an upper surface of the drift layer, a part of the body layer being exposed at an upper surface of a semiconductor substrate; a first conductivity type source layer provided on a part of an upper surface of the body layer, being exposed at the upper surface of the semiconductor substrate and being separated from the drift layer by the body layer; a first conductivity type drain layer contacting a lower surface of the drift layer and being exposed at a lower surface of the semiconductor substrate; a trench gate penetrating the body layer and contacting the drift layer, a second conductivity type first semiconductor layer surrounding a bottom of the trench gate and being separated from the body layer by the drift layer; a first conductivity type second semiconductor layer disposed along one of end portions of the trench gate in a longitudinal direction of the trench gate, one of end portions of the second semiconductor layer contacting the body layer and the other of the end portions of the second semiconductor layer contacting the first semiconductor layer; and a connecting layer, one of end portions of the connecting layer being connected to the body layer and the other of the end portions of the connecting layer being connected to the first semiconductor layer, the connecting layer contacting the second semiconductor layer, and the connecting layer being separated from the one of the end portions of the trench gate in the longitudinal direction of the trench gate by the second semiconductor layer.

According to the above-described semiconductor device, the connecting layer that has the end portions connected to the body layer and the first semiconductor layer, respectively, is separated from the one of the end portions of the trench gate in the longitudinal direction of the trench gate by the second semiconductor layer. Therefore, the damage to the connecting layer is avoided during a manufacturing process of the semiconductor device. Further, a size and the like of the connecting layer can be examined by the inspection without being affected by the edge effect of the trench. It is possible to stably form the connecting layer that serves as the carrier supply path from the body layer to the floating structure, and to provide the semiconductor device with excellent on-resistance property and yield.

The connecting layer may be a second conductivity type semiconductor layer. A density of second conductivity type impurities in the second semiconductor layer may be higher than a density of second conductivity type impurities in the drift layer.

DETAILED DESCRIPTION OF INVENTION

According to a semiconductor device as disclosed herein, a connecting layer needs to be a layer having a function as a carrier supply path from a body layer to a floating structure, and the connecting layer may be a second conductivity type semiconductor layer or a conductive layer. Specifically, a metal layer such as tungsten, a conductive polysilicon layer and the like may be exemplified, in addition to the second conductivity type semiconductor layer.

When the connecting layer is the second conductivity type semiconductor layer, a density of second conductivity type impurities may be lower than, higher than, or nearly equal to a density of second conductivity type impurities in the first semiconductor layer. When the density of the second conductivity type impurities in the connecting layer is lower than that of the first semiconductor layer, carrier mobility while a gate electrode is turned on is reduced, and at the same time, the connecting layer is depleted quickly while the gate electrode is turned off, which makes it likely that the first semiconductor layer enters a floating state. When the density of the second conductivity type impurities in the connecting layer is higher than that of the first semiconductor layer, the carrier mobility while the gate electrode is turned on is increased, and at the same time, the connecting layer is depleted slightly slowly while the gate electrode is turned off. According to the semiconductor device as disclosed herein, however, the connecting layer is in contact with the first conductivity type second semiconductor layer, and the depletion of the connecting layer also progresses from an interface with the second semiconductor layer. Therefore, it is more likely that the first semiconductor layer enters the floating state, as compared with the conventional semiconductor device.

The second semiconductor layer may be a layer that is different from a drift layer, or may be a layer that is formed integrally with the drift layer. Further, the density of the first conductivity type impurities in the second semiconductor layer may be higher than, lower than, or nearly equal to the density of the first conductivity type impurities in the drift layer. When the density of the first conductivity type impurities in the second semiconductor layer is higher than the density of the first conductivity type impurities in the drift layer, the depletion of the connecting layer as the second conductivity type semiconductor layer is facilitated further when the gate electrode is turned off. In addition, a layer having the high density of the first conductivity type impurities may be formed at a region that is in the drift layer, opposite to the second semiconductor layer, and in contact with the connecting layer. Thereby, the depletion of the connecting layer as the second conductivity type semiconductor layer is facilitated further when the gate electrode is turned off.

First Embodiment

Figure 1:
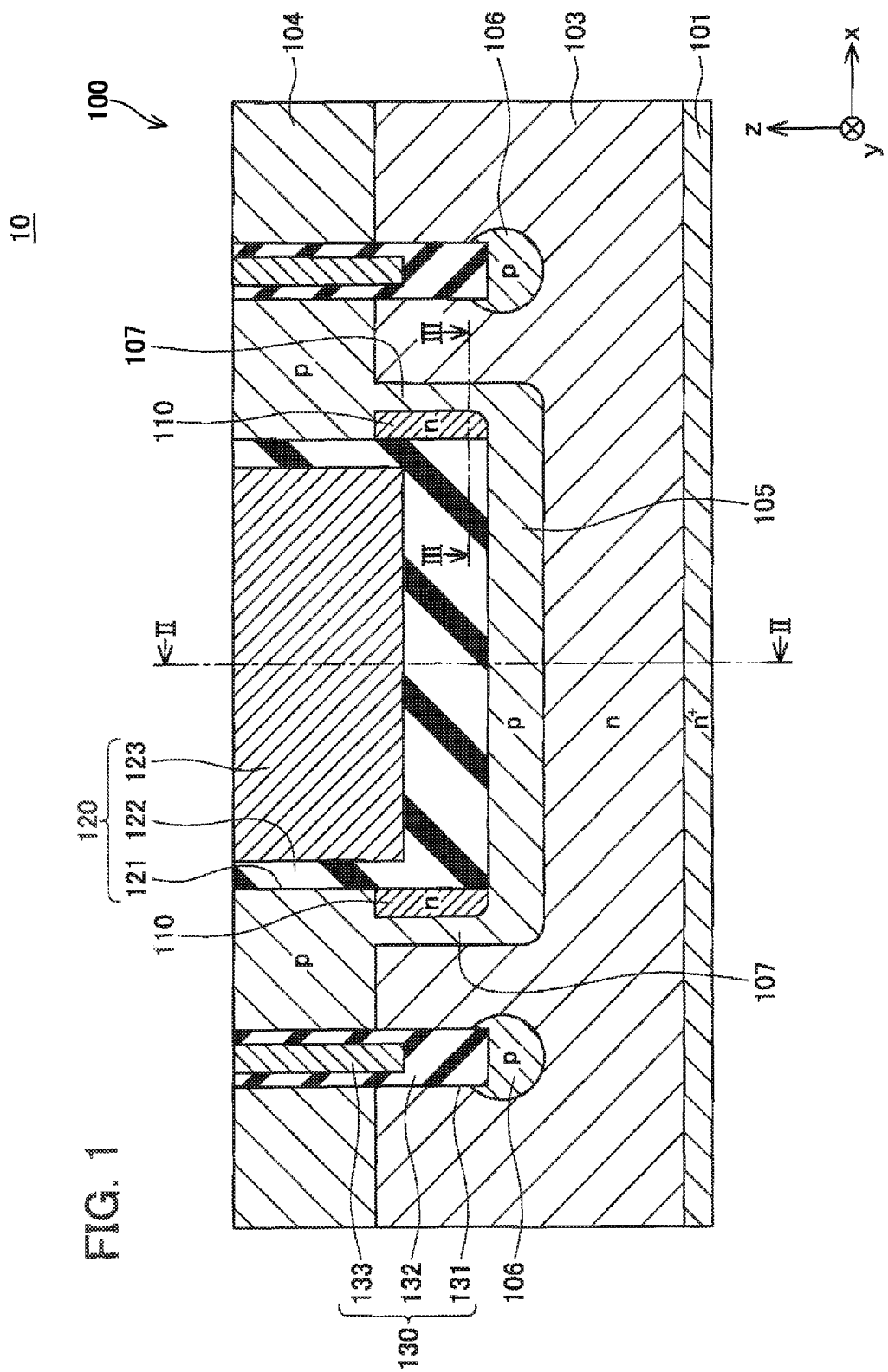
FIG. 1 is a vertical cross-sectional view of a semiconductor device according to a first embodiment.

FIG. 1 shows a semiconductor device 10 according to a first embodiment. The semiconductor device 10 includes a semiconductor substrate 100, a trench gate 120 that is formed on an upper surface side of the semiconductor substrate 100 (a positive direction side of a z-axis), and peripheral trenches 130. The semiconductor substrate 100 is formed by silicon carbide.

Figure 2:
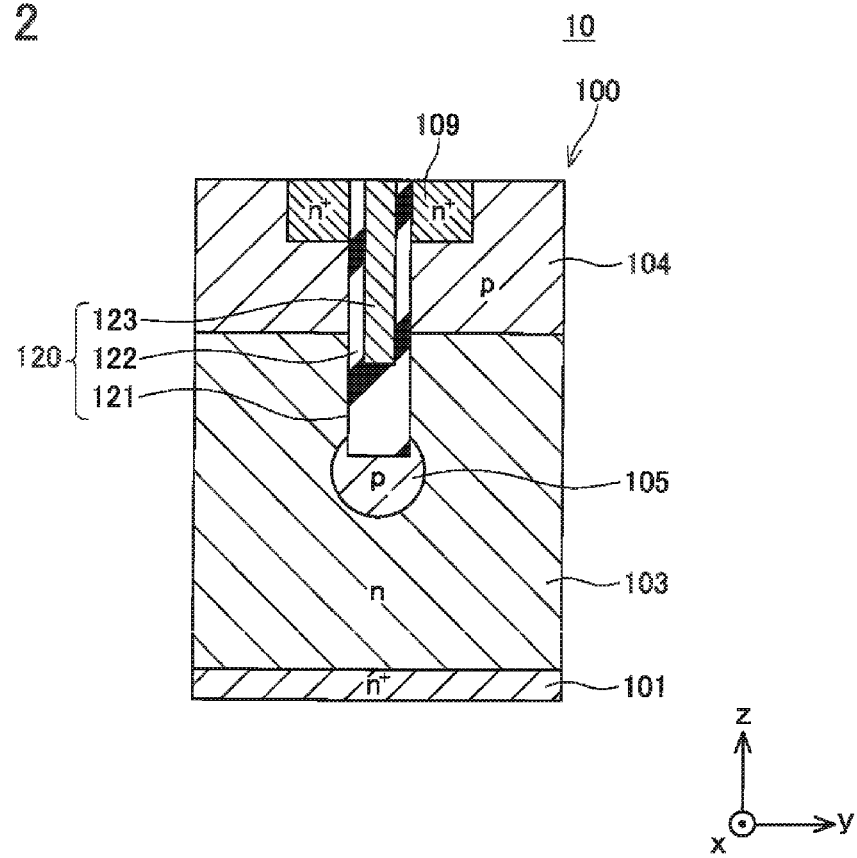
FIG. 2 is a cross-sectional view taken along a II-II line in FIG. 1.

A vertical MOSFET is formed in the semiconductor substrate 100. As shown in FIG. 1 and FIG. 2, the semiconductor substrate 100 includes an n-type drain layer 101, an n-type drift layer 103, a p-type body layer 104, an n-type source layer 109, a p-type first semiconductor layer 105, a p-type semiconductor layer 106, a p-type connecting layer 107, and an n-type second semiconductor layer 110. The body layer 104 is in contact with an upper surface of the drift layer 103, and a part of the body layer 104 is exposed on an upper surface of the semiconductor substrate 100. The source layer 109 is provided on a part of an upper surface of the body layer 104, is exposed on the upper surface of the semiconductor substrate 100, and is separated from the drift layer 103 by the body layer 104. The drain layer 101 is in contact with a lower surface of the drift layer 103, and is exposed on a lower surface of the semiconductor substrate 100. The source layer 109 and the body layer 104 are electrically connected to a not-shown source electrode, and the drain layer 101 is electrically connected to a not-shown drain electrode.

The first semiconductor layer 105 surrounds a bottom of the trench gate 120, and is separated from the body layer 104 by the drift layer 103. The semiconductor layer 106 surrounds a bottom of each peripheral trench 130, and is separated from the body layer 104 by the drift layer 103.

The second semiconductor layer 110 is provided along each end portion of the trench gate 120 in a longitudinal direction (an x-direction) of the trench gate 120. The second semiconductor layer 110 is in contact with the body layer 104 at its end portion in the positive direction of the z-axis, and is in contact with the first semiconductor layer 105 at its end portion in a negative direction of the z-axis. Further, the second semiconductor layer 110 is in contact with the end portion of the trench gate 120 in the longitudinal direction (the x-direction) of the trench gate 120.

The connecting layer 107 is connected to the body layer 104 at its end portion in the positive direction of the z-axis, and connected to the first semiconductor layer 105 at its end portion in the negative direction of the z-axis. The connecting layer 107 is in contact with the drift layer 103 at its one side in the x-direction, in contact with the second semiconductor layer 110 at the other side, and separated from the end portion of the trench gate 120 in the longitudinal direction of the trench gate 120 by the second semiconductor layer 110. A density of p-type impurities in the connecting layer 107 is lower than a density of p-type impurities in the first semiconductor layer 105.

Figure 3:
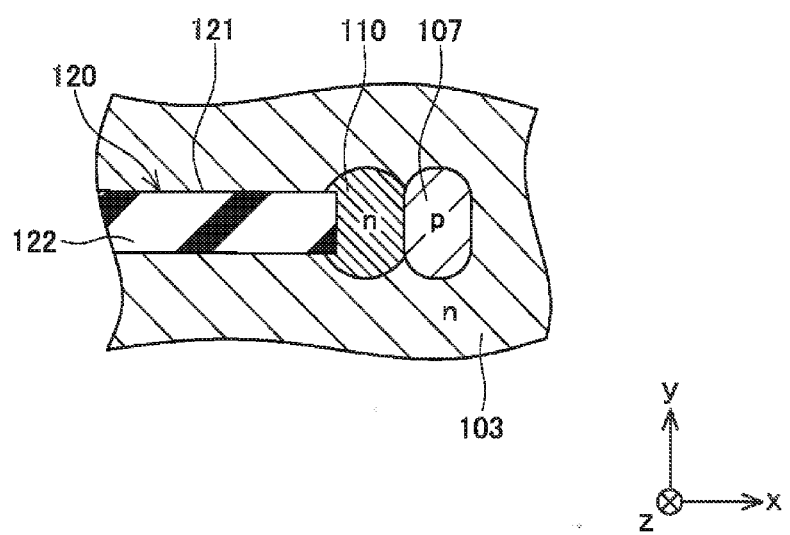
FIG. 3 is a cross-sectional view taken along a line III-III in FIG. 1.

FIG. 3 shows a cross section that includes the second semiconductor layer 110 and the connecting layer 107 and that is in parallel to an xy-plane. In this cross section, the second semiconductor layer 110 and the connecting layer 107 have an island shape. The second semiconductor layer 110 is in contact with a side surface of the trench gate 120 at its one side in the x-direction, in contact with the connecting layer 107 at the other side, and in contact with the drift layer 103 in a y-direction.

The trench gate 120 includes a trench 121 that penetrates the body layer 104 from the upper surface of the semiconductor substrate 100 to reach the drift layer 103, a gate insulating film 122 that is formed on an inner wall surface of the trench 121, and a gate electrode 123 that is covered by the gate insulating film 122 and filled inside the trench 121. The gate electrode 123 faces the source layer 109 and the body layer 104 in a range where the body layer 104 separates the source layer 109 and the drift layer 103, via the gate insulating film 122.

When a gate voltage is turned off, a depletion layer increases from p-n junction planes between the connecting layer 107 and the second semiconductor layer 110 and the drift layer 103, which allows the connecting layer 107 to have a high resistance, and the first semiconductor layer 105 to enter a floating state. The density of the p-type impurities, a shape and a size of the connecting layer 107 are adjusted so that at least a part of the connecting layer 107 in a thickness direction of the semiconductor substrate 100 (a z-direction) is depleted prior to the first semiconductor layer 105, when the gate voltage is turned off. When the first semiconductor layer 105 is in the floating state, a peak of field intensity is dispersed and the semiconductor device 10 is given durability to a high voltage.

When the semiconductor device 10 is switched from off to on while the depletion layer is increased, the depletion layer is narrowed and the connecting layer 107 serves as a carrier supply path from the body layer 104 to the first semiconductor layer 105. When the carrier is supplied from the body layer 104, the depletion layer of the first semiconductor layer 105 is narrowed quickly and an on-resistance of the semiconductor device 10 is reduced.

According to the semiconductor device 10 as described thus far, it is possible to realize both of the higher voltage and the lower on-resistance that used to have a trade-off relationship. Further, according to the semiconductor device 10, the connecting layer 107 is in contact with both of the drift layer 103 and the second semiconductor layer 110, and the depletion of the connecting layer 107 progresses not only from the p-n junction with the drift layer 103 but also from the p-n junction with the second semiconductor layer 110. This allows the first semiconductor layer 105 to enter the floating state more quickly when the gate voltage is turned off, as compared with the conventional semiconductor device.

Figure 4:
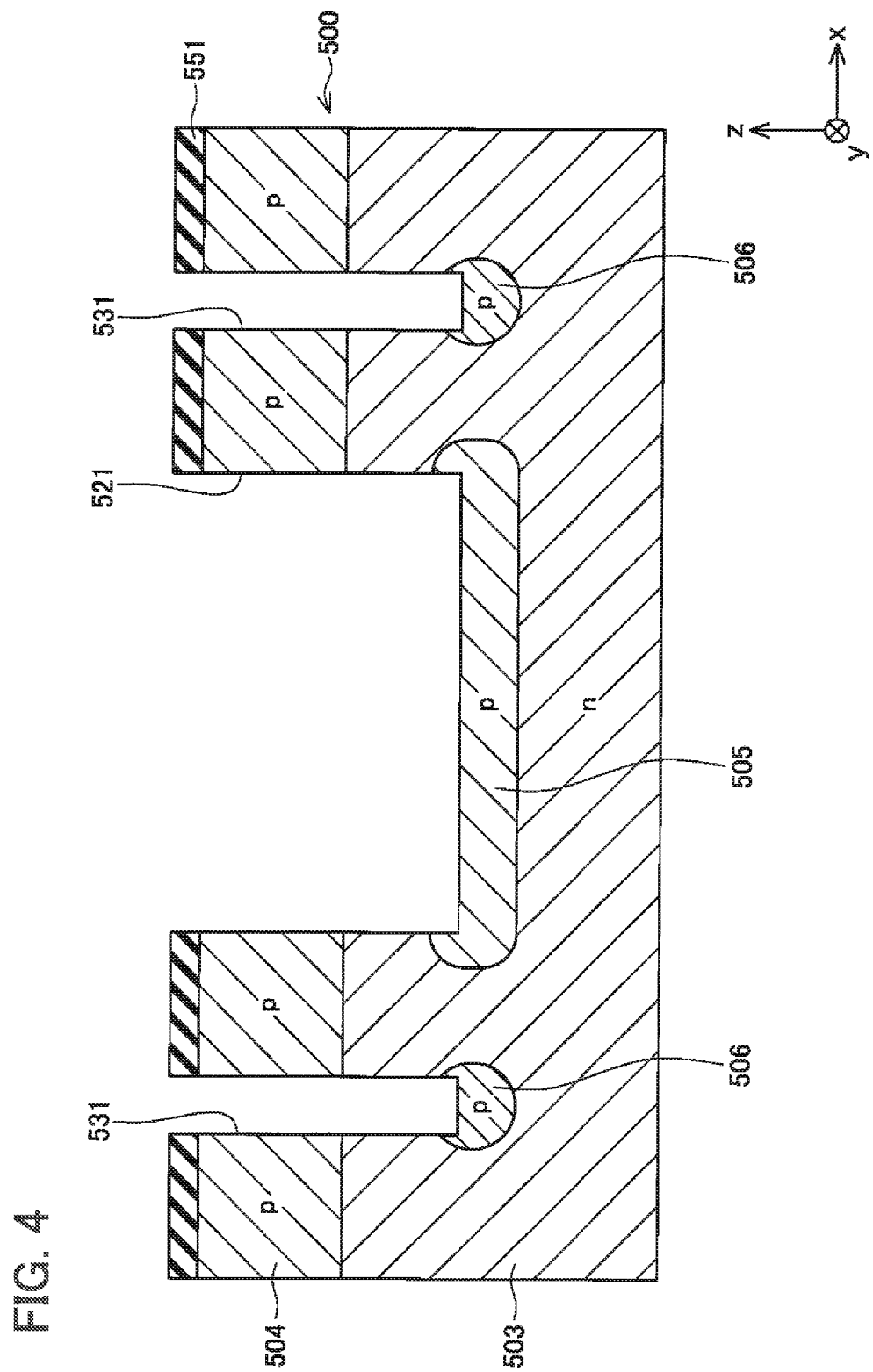
FIG. 4 is a view showing a step of manufacturing the semiconductor device according to the first embodiment.

FIG. 4 to FIG. 7 show an example of a manufacturing method of the semiconductor device 10. According to this manufacturing method, a semiconductor wafer 500 is first provided, which is formed by silicon carbide and includes an n-layer 503 (a layer to be the drift layer 103), a p-layer 504 formed on an upper surface of the n-layer 503 (a layer to be the body layer 104), and an n-layer formed on a part of an upper surface of the p-layer 504 (a layer to be the source layer 109, not shown in FIG. 4 to FIG. 7), as shown in FIG. 4. Next, a mask 551 is formed on an upper surface of the semiconductor wafer 500 so as to form trenches 521 and 531 that penetrate the p-layer 504 to reach the n-layer 503 by etching on the upper surface side of the semiconductor wafer 500. Then, p-type impurity ions are implanted in a bottom of the trenches 521 and 531 along a depth direction of the semiconductor wafer 500 (the z-direction) so as to form a first semiconductor layer 505 (a layer to be the first semiconductor layer 105) and a semiconductor layer 506 (a layer to be the semiconductor layer 106).

Figure 5:
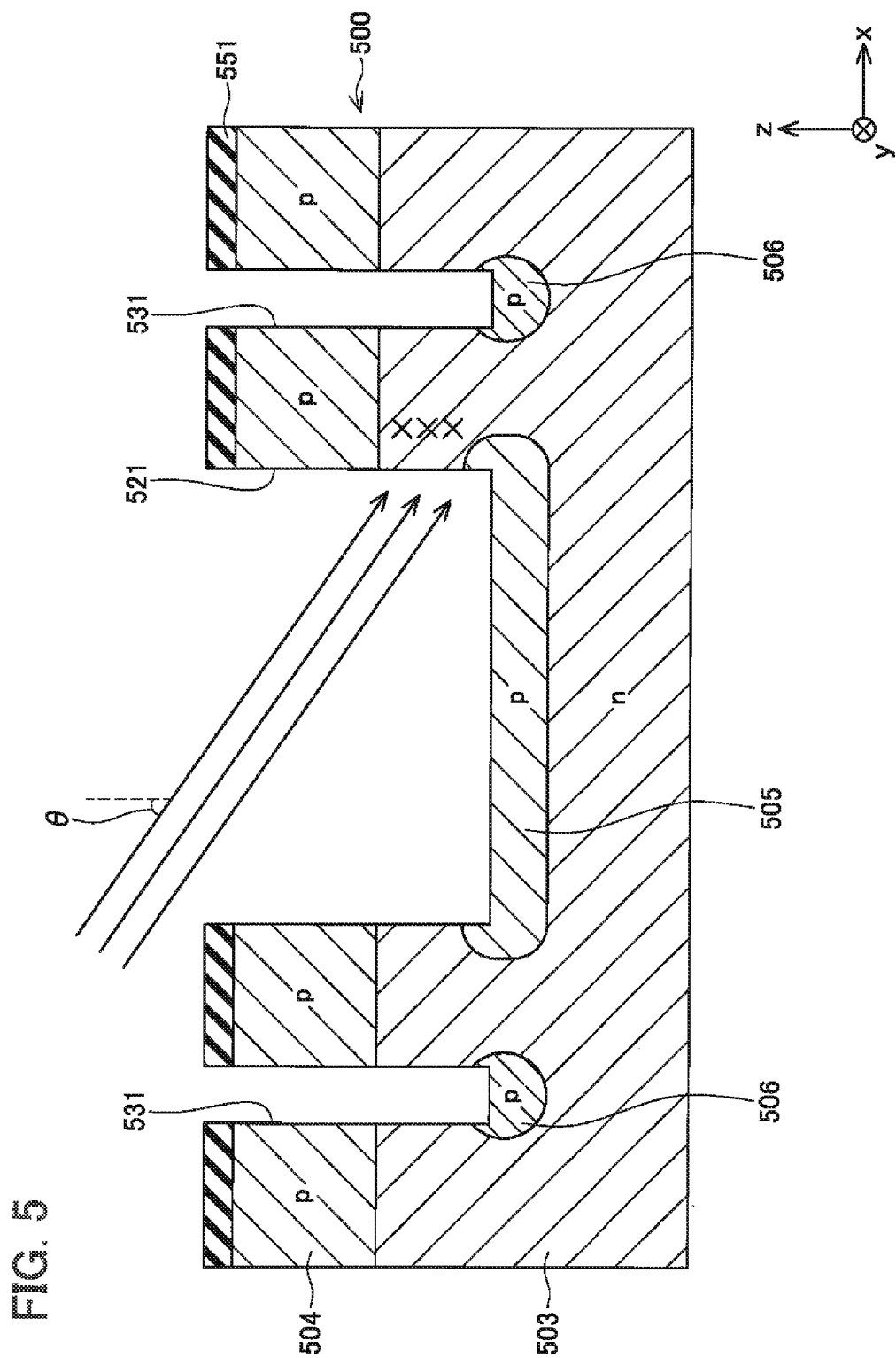
FIG. 5 is a view showing a step of manufacturing the semiconductor device according to the first embodiment.

Next, as shown in FIG. 5, the p-type impurity ions are implanted in the n-layer 503, at a position slightly apart from an inner wall surface of the trench 521 in the x-direction, diagonally from the upper surface side of the semiconductor wafer 500. The impurity ions are implanted in a direction having an angle θ relative to the z-direction. Adjustment of the angle θ is made as needed according to a depth of the trench 521 (a width in the z-direction) and a width in a longitudinal direction (the x-direction). For example, the angle θ is adjusted so as to avoid a case where the impurity ions do not reach the inner wall surface of the trench 521 in the x-direction as the impurity ions hit the upper surface of the semiconductor wafer 500 (the surface where the trench is not formed).

Figure 6:
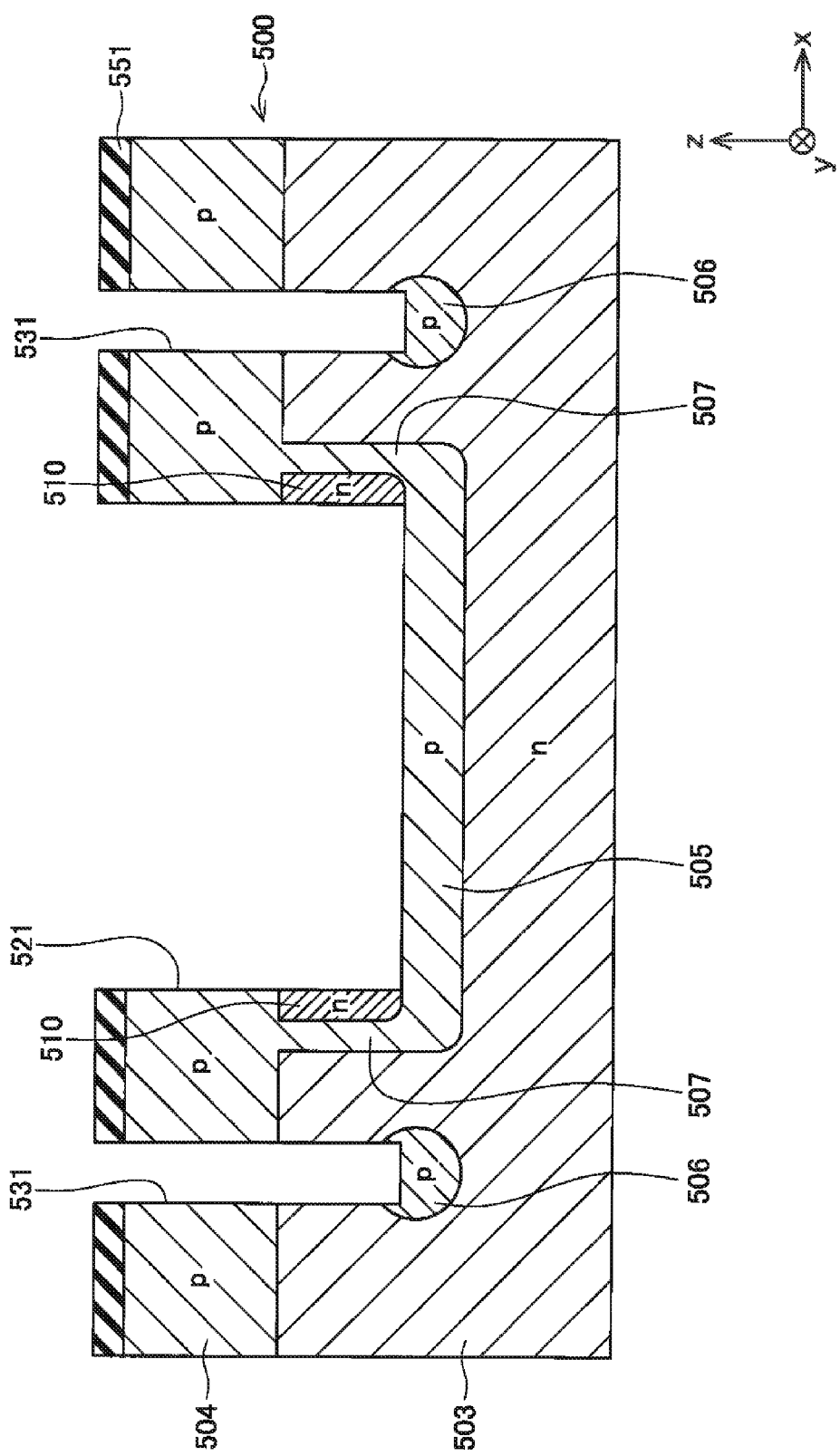
FIG. 6 is a view showing a step of manufacturing the semiconductor device according to the first embodiment.

The ion implantation is also made diagonally to the inner wall surface of the trench 521 that is opposite to the one shown in FIG. 5 in terms of the x-direction, so as to form a p-layer 507 (a layer to be the connecting layer 107) at a position where the impurity ions are implanted, and an n-layer 510 (a layer to be the second semiconductor layer 110) between the trench 521 and the p-layer 507, as shown in FIG. 6. Next, the mask 511 is removed, and activation annealing is performed at about 1700° C.

Figure 7:
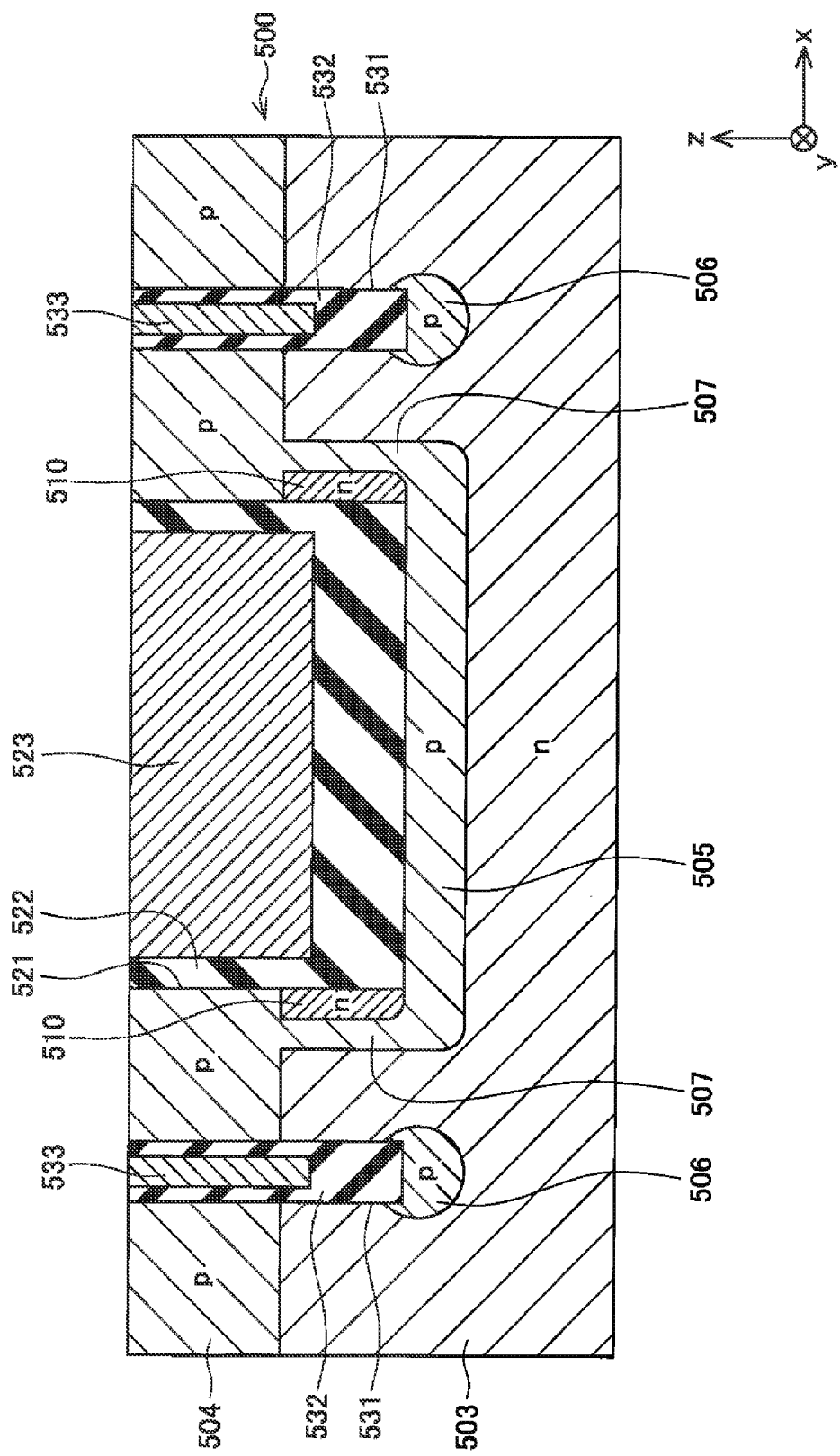
FIG. 7 is a view showing a step of manufacturing the semiconductor device according to the first embodiment.

Next, a silicon oxide film is filled in the trenches 521 and 531 by CVD or the like, and thereafter, unnecessary silicon oxide film, except for portions near the bottom, are etched back and removed. Then, the silicon oxide film is formed on inner wall surfaces of the trenches 521 and 531 by sacrificial oxidation, and post oxidation annealing (POA) is performed at about 1300° C. Further, polysilicon is filled in the trenches 521 and 531. Thereby, as shown in FIG. 7, a gate electrode 523 that is formed by the polysilicon and covered by a gate insulating film 522 formed by the silicon oxide is filled in the trench 521, so as to form a trench gate 520 (to be the trench gate 120). At the same time, a conductive layer 533 that is formed by the polysilicon and covered by an insulating layer 532 formed by the silicon oxide is filled in the trenches 531, so as to form peripheral trenches 530 (to be the peripheral trenches 130). Incidentally, the unnecessary silicon oxide film and polysilicon that are formed on the upper surface and the like of the semiconductor wafer 500 are etched back and removed. Then, an n-layer to be the drain layer is formed by implanting n-type impurity ions in a lower surface of the semiconductor wafer 500 and performing annealing by a laser annealing method, so as to manufacture the semiconductor device 10 as shown in FIG. 1.

According to the manufacturing method of the semiconductor device 10 as described thus far, the semiconductor wafer 500 is subjected to the ion implantation and then the annealing at 1700° C., in order to form the connecting layer 107 and the like. As it is necessary to perform the annealing at a high temperature in order to activate the implanted ions according to the semiconductor device 10 formed by the silicon carbide, a step of manufacturing the trench gate 120 or the like needs to be performed after a process of forming the connecting layer 107. For this reason, in the step of forming the trench gate 120 and the like, the semiconductor wafer 500 may be reduced from an inner wall surface of the trench 120. According to the semiconductor device 10, the connecting layer 107 is separated from the end portion of the trench gate 120 in the longitudinal direction (the x-direction) of the trench gate 120 by the second semiconductor layer 110 and not in contact with the trench gate 120. Therefore, the connecting layer 107 is not reduced even when the semiconductor wafer 500 is reduced in the step of manufacturing the trench gate 120 and the like. In addition, in an inspection process of the manufactured semiconductor device 10, it is possible to examine the size and the like of the connecting layer 107 by the inspection, without being affected by an edge effect of the trench 121. The semiconductor device 10 has excellent on-resistance property and yield.

(Modification)

Figure 8:
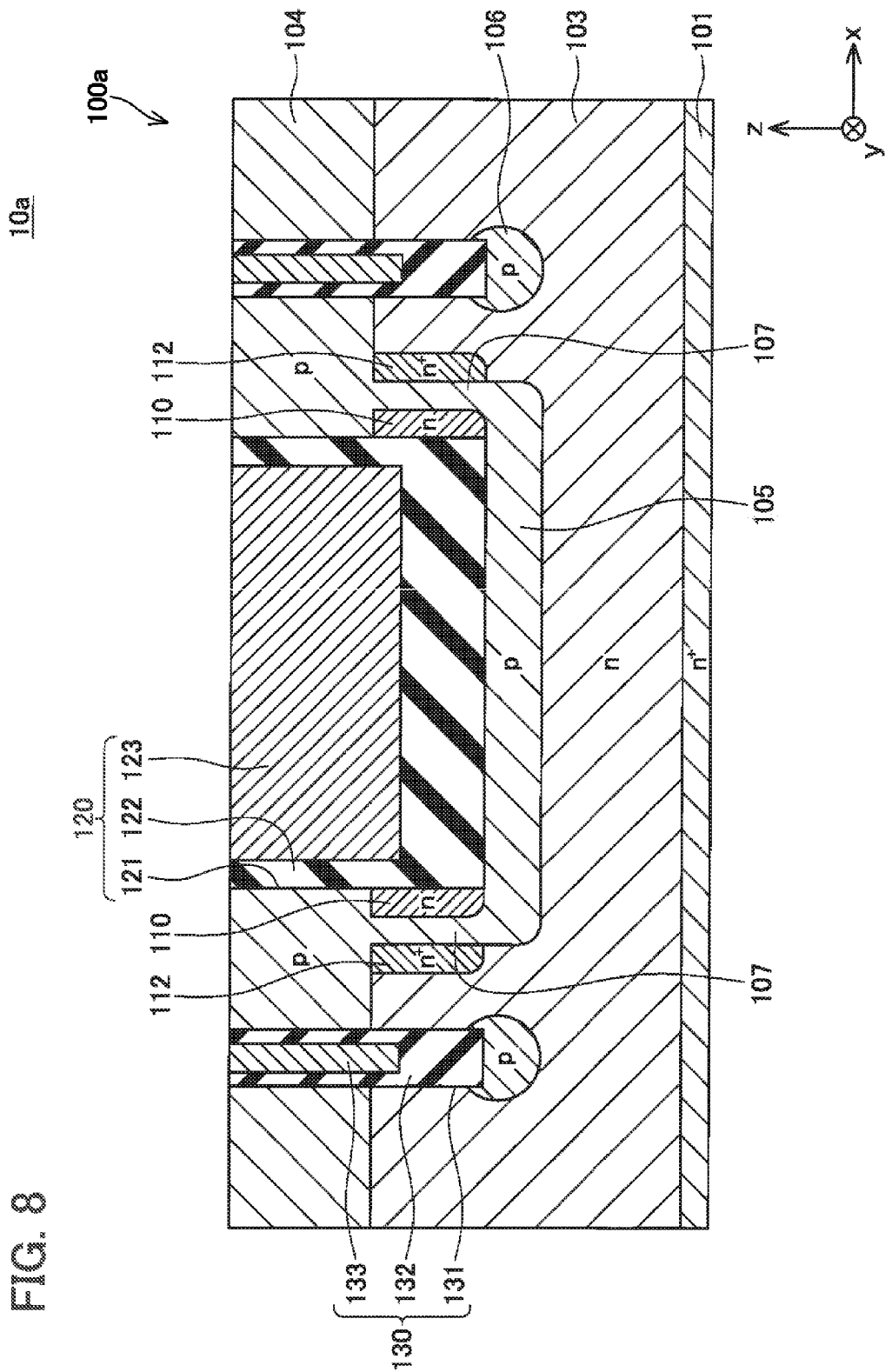
FIG. 8 is a vertical cross-sectional of a semiconductor device according to a modification.
Figure 9:
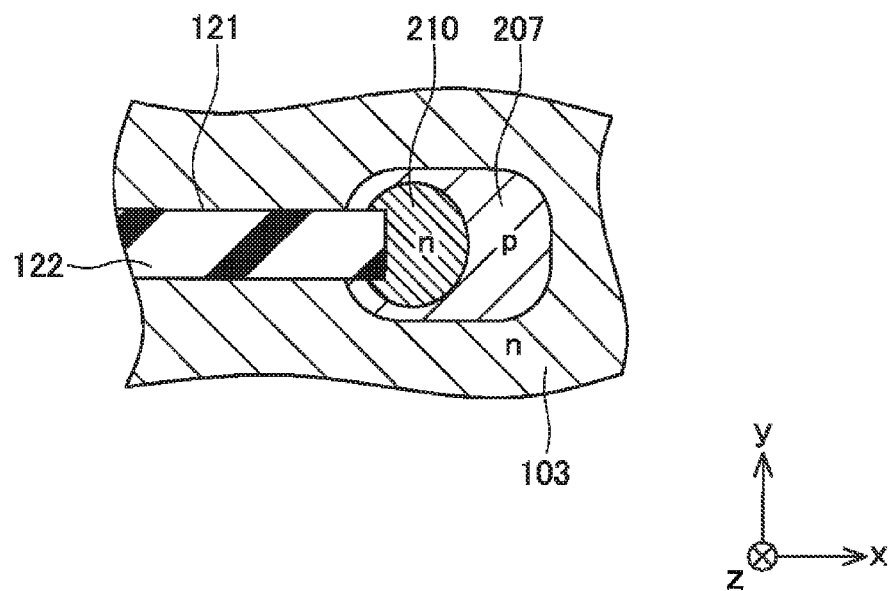
FIG. 9 is a cross-sectional view showing a section of the semiconductor device according to the modification, the section being the same as that of FIG. 3.

In order to form the second semiconductor layer 110, the n-type impurity ions may be implanted at a position closer to the inner wall surface of the trench 521 in the x-direction. Further, as shown in FIG. 8, an n-type semiconductor layer 112 may be further provided at a position opposing to the second semiconductor layer 110 in the x-direction with the connecting layer 107 therebetween. The n-type semiconductor layer 112 can be similarly formed by, for example, implanting the n-type impurity ions in the n-layer 503, at a position slightly apart from the inner wall surface of the trench 521 in the x-direction, diagonally from the upper surface side of the semiconductor wafer 500, before the step of irradiating the semiconductor wafer 500 with the p-type impurity ions as shown in FIG. 5. Further, as shown in FIG. 9, a first semiconductor layer 210 may be surrounded by the connecting layer 207 and separated from the drift layer 103.

Further, the density of the p-type impurities in the connecting layer 107 may be nearly equal to or higher than that of the first semiconductor layer 105. The connecting layer 107 is in contact with the drift layer 103 and the second semiconductor layer 110, and the depletion of the connecting layer 107 progresses from the p-n junction planes with both of the drift layer 103 and the second semiconductor layer 110. This makes it easy to allow the first semiconductor layer 105 to enter the floating state, even when the density of the p-type impurities in the connecting layer 107 is relatively high. Moreover, instead of the connecting layer 107, the conductive layer of the polysilicon layer, the metal layer such as tungsten, and the like may be used as the connecting layer. In this case, the connecting layer may be embedded in the drift layer. When the connecting layer is formed by being embedded in the drift layer, the second semiconductor layer may be a part of the drift layer.

While embodiments of the present invention have been described in detail, such embodiments are merely illustrative and are not intended to limit the scope of claims. Techniques described in the scope of claims include various modifications and changes made to the specific examples illustrated above.

It is to be understood that the technical elements described in the present description and the drawings exhibit technical usefulness solely or in various combinations thereof and shall not be limited to the combinations described in the claims at the time of filing. Furthermore, the techniques illustrated in the present description and the drawings are to achieve a plurality of objectives at the same time, whereby technical usefulness is exhibited by attaining any one of such objectives.

The invention claimed is:

1. A semiconductor device comprising:
    a first conductivity type drift layer;
    a second conductivity type body layer contacting an upper surface of the drift layer, a part of the body layer being exposed at an upper surface of a semiconductor substrate;
    a first conductivity type source layer provided on a part of an upper surface of the body layer, being exposed at the upper surface of the semiconductor substrate and being separated from the drift layer by the body layer,
    a first conductivity type drain layer contacting a lower surface of the drift layer and being exposed at a lower surface of the semiconductor substrate;
    a trench gate penetrating the body layer and contacting the drift layer;
    a second conductivity type first semiconductor layer surrounding a bottom of the trench gate and being separated from the body layer by the drift layer;
    a first conductivity type second semiconductor layer disposed along one of end portions of the trench gate in a longitudinal direction of the trench gate, one of end portions of the second semiconductor layer contacting the body region and the other of the end portions of the second semiconductor layer contacting the first semiconductor layer; and
    a connecting layer, one of end portions of the connecting layer being connected to the body region and the other of the end portions of the connecting layer being connected to the first semiconductor layer, the connecting layer contacting the second semiconductor layer, and the connecting layer being separated from the one of the end portions of the trench gate in the longitudinal direction of the trench gate by the second semiconductor layer.

2. A semiconductor device of claim 1, wherein the connecting layer is a second conductivity type semiconductor layer.

3. A semiconductor device of claim 1, wherein a density of first conductivity type impurities in the second semiconductor layer is higher than a density of first conductivity type impurities in the drift region.

* * * * *